United States Patent
Tan et al.

(10) Patent No.: US 7,323,769 B2
(45) Date of Patent: Jan. 29, 2008

(54) HIGH PERFORMANCE CHIP SCALE LEADFRAME PACKAGE WITH THERMAL DISSIPATING STRUCTURE AND ANNULAR ELEMENT AND METHOD OF MANUFACTURING PACKAGE

(75) Inventors: Hien Boon Tan, Singapore (SG); Anthony Yi Sheng Sun, Singapore (SG); Francis Koon Seong Poh, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 0 days.

(21) Appl. No.: 11/429,248

(22) Filed: May 8, 2006

(65) Prior Publication Data
US 2006/0202313 A1 Sep. 14, 2006

Related U.S. Application Data

(63) Continuation of application No. 10/721,384, filed on Nov. 26, 2003, now abandoned.

(60) Provisional application No. 60/429,315, filed on Nov. 27, 2002.

(51) Int. Cl.
*H01L 23/495* (2006.01)
*H01L 23/48* (2006.01)

(52) U.S. Cl. ......... 257/684; 257/E25.02; 257/E23.061; 257/E23.004; 257/E23.039; 257/E23.092; 257/E23.043; 257/E23.036; 257/E23.066; 257/666; 257/698; 257/696; 257/796; 257/706; 257/711; 257/718; 257/780; 257/675; 257/677; 257/712; 257/713; 257/707; 257/704; 257/676; 257/E23.124

(58) Field of Classification Search ........ 257/E23.039, 257/E23.092, E23.124, E25.023, E23.061, 257/E23.004, E23.043, E23.036, E23.066, 257/684, 666, 698, 669–676, 795, 712, 713, 257/707, 704, 717, 720, 719, 706, 796, 711, 257/718, 780, 677
See application file for complete search history.

(56) References Cited

U.S. PATENT DOCUMENTS 5,293,301 A 3/1994 Tanaka et al.

(Continued)

*Primary Examiner*—Alexander Oscar Williams
(74) *Attorney, Agent, or Firm*—Sughrue Mion, PLLC

(57) ABSTRACT

An integrated circuit package is disclosed. The package comprises a plurality of leads, each lead having a first face and a second face opposite to the first face. The package also comprises a die pad having a first face and a second face opposite to the first face. The second face of the die pad is orthogonally offset from the second face of the leads so that the second face of the die pad and the second face of the leads are not coplanar. The package also comprises an integrated circuit chip substantially laterally disposed between the plurality of leads, and having a first face and a second face opposite to the first face. The first face of the integrated circuit chip is proximate to the second face of the die pad and the first face of the integrated circuit chip is coupled to the second face of the die pad. The package further comprises a plurality of wires that link the plurality of leads to the integrated circuit chip. Each of the wires has a first end electrically conductively joined to the first face of the integrated circuit chip. The first end of the wire, therefore, is disposed between a plane defined by the second face of the die pad and a plane defined by the first face of the integrated circuit chip. Each of the wires also has a second end electrically conductively joined to the first face of one of the leads. The second end of the wire, therefore, is disposed between a plane defined by a first face of the die pad and a plane defined by the first face of the lead to which it is joined.

20 Claims, 8 Drawing Sheets

U.S. PATENT DOCUMENTS

| | | |
|---|---|---|
| 5,311,060 A | 5/1994 | Rostoker et al. |
| 5,363,279 A | 11/1994 | Cha |
| 5,428,248 A | 6/1995 | Cha |
| 5,519,251 A | 5/1996 | Sato et al. |
| 5,705,851 A * | 1/1998 | Mostafazadeh et al. ..... 257/675 |
| 5,770,888 A | 6/1998 | Song et al. |
| 5,789,280 A | 8/1998 | Yokota |
| 5,894,108 A | 4/1999 | Mostafazadeh et al. |
| 5,936,303 A * | 8/1999 | Nishi .......... 257/675 |
| 6,166,430 A | 12/2000 | Yamaguchi |
| 6,177,718 B1 | 1/2001 | Kozono |
| 6,184,580 B1 * | 2/2001 | Lin .......... 257/712 |
| 6,198,171 B1 | 3/2001 | Huang et al. |
| 6,265,771 B1 | 7/2001 | Ference et al. |
| 6,271,581 B2 | 8/2001 | Huang et al. |
| 6,285,075 B1 * | 9/2001 | Combs et al. .......... 257/675 |
| 6,348,729 B1 * | 2/2002 | Li et al. .......... 257/691 |
| 6,388,340 B2 * | 5/2002 | Distefano .......... 257/787 |
| 6,433,277 B1 | 8/2002 | Glenn |
| 6,437,427 B1 * | 8/2002 | Choi .......... 257/666 |
| 6,444,498 B1 | 9/2002 | Huang et al. |
| 6,599,525 B2 | 7/2003 | Scamilla Aledo et al. |
| 6,627,981 B2 * | 9/2003 | Shibata .......... 257/678 |
| 6,630,371 B2 | 10/2003 | Hembree |
| 6,646,339 B1 * | 11/2003 | Ku et al. .......... 257/708 |
| 6,713,322 B2 * | 3/2004 | Lee .......... 438/123 |
| 6,724,071 B2 | 4/2004 | Combs |
| 6,818,982 B2 * | 11/2004 | Kim .......... 257/707 |
| 2001/0035569 A1 * | 11/2001 | Shibata .......... 257/667 |
| 2005/0009239 A1 * | 1/2005 | Wolff et al. .......... 438/123 |

* cited by examiner

HIGH PERFORMANCE CHIP SCALE LEADFRAME PACKAGE WITH THERMAL DISSIPATING STRUCTURE AND ANNULAR ELEMENT AND METHOD OF MANUFACTURING PACKAGE

This application claims the benefit of the now abandoned U.S. Provisional Application No. 60/429,315 filed on Nov. 27, 2002, and incorporated herein by reference. This application is a continuation of U.S. application Ser. No. 10/721,384 filed on Nov. 26, 2003, which has been abandoned.

BACKGROUND OF THE INVENTION

1. Field of the Invention

The present invention generally relates to the field of semiconductors. In particular, the present invention relates to an improved integrated circuit package and a method of assembling the same.

2. Discussion of Related Art

Semiconductors are materials that have characteristics of insulators and conductors. In today's technology, semiconductor materials have become extremely important as the basis for transistors, diodes, and other solid-state devices. Semiconductors are usually made from germanium or silicon, but selenium and copper oxide, as well as other materials are also used. When properly made, semiconductors will conduct electricity in one direction better than they will in the other direction.

Semiconductor devices and integrated circuits (ICs) are made up of components such as transistors, and diodes, and elements such as resistors and capacitors linked together by conductive connections to form one or more functional circuits. Interconnects on an IC chip serve the same function as the wiring in a conventional circuit.

Often, IC manufacturing methods use molds to form the IC package. The protective coatings on the package typically completely encompass the IC, wire bonds, and electrical contacts of the IC carrier or substrate.

Emerging electronic product applications are creating a set of challenges for the IC packaging industry.

Once the IC chips have been produced and encapsulated in semiconductor packages as described, they may be used in a wide variety of electronic appliances. The variety of these electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, which results in increased consumer demand. It is increasingly desirable, therefore, to reduce the profile of the semiconductor package so that electronic systems can be incorporated into more compact devices and products.

As ICs operate, they tend to consume an amount of electricity that is used to operate the various electrical components of the IC. As the speed of ICs increases, so does the amount of electricity which they consume increase. The electricity consumed by an IC tends to be predominantly discarded as heat. Thus, as the speed of ICs has increased, so has the amount of heat which the ICs produce increased.

As mentioned, some IC manufacturing methods use molds or encapsulants to form the IC packages and to protect the package. Unfortunately, the protective coatings also tend to function as an insulating layer and may substantially impede thermal dissipation from the IC. Thus, the heat dissipation of such IC packages is degraded due to the configuration of the protective coatings of the package.

SUMMARY OF THE INVENTION

An IC package according to the present invention comprises a plurality of leads, each having a first face and a second face opposite to the first face. The package also comprises a die pad having a first face and a second face opposite to the first face. The second face of the die pad is orthogonally offset from the second face of the plurality of leads, so that the second face of the die pad and the second face of the plurality of leads are not coplanar. The package also comprises an IC chip substantially laterally disposed between the plurality of leads and having a first face and a second face opposite to the first face. The package further comprises a plurality of wires linking the plurality of leads to the IC chip. Each of the plurality of wires has a first end electrically conductively joined to the first face of the IC chip. The first end of each of the plurality of wires is disposed between a plane defined by the second face of the die pad and a plane defined by the first face of the IC chip. Each of the plurality of wires also has a second end electrically conductively joined to the first face of one of the plurality of leads. The second end of each of the plurality of wires is disposed between a plane defined by the first face of the die pad and a plane defined by the first face of the lead to which the die pad is joined.

According to a further aspect of a first exemplary embodiment, the first face of the die pad is adapted to direct coupling with a heat sink.

According to another further aspect of the first exemplary embodiment, the IC package further comprises an encapsulant surrounding the first face of the IC chip, the first faces of the plurality of leads, the wires, and the second face of the die pad. The first face of the die pad is adapted to direct coupling with a heat sink. Additionally, the encapsulant can be a polymer-based molding compound. Further, a planar surface can be formed comprising the first face of the die pad and an outer surface of the encapsulant.

According to yet another aspect of the first embodiment, the IC package further comprises a thermal dissipation element having a first face and a second face opposite to the first face, wherein the second face of the thermal dissipation element is coupled to the first face of the die pad.

According to a second exemplary embodiment of the present invention, an IC package comprises a plurality of leads, each having a first face and a second face opposite to the first face. The package also comprises a die pad having a first face and a second face opposite to the first face. The second face of the die pad is orthogonally offset from the second face of the plurality of leads, so that the second face of the die pad and the second face of the plurality of leads are not coplanar. The package also comprises an IC chip substantially laterally disposed between the plurality of leads and having a first face and a second face opposite to the first face. The package also comprises a plurality of wires linking the plurality of leads to the IC chip. Each of the wires has a first end electrically conductively joined to the first face of the IC chip and a second end electrically conductively joined to a first face of one of the plurality of leads. The package further comprises an annular element, substantially laterally disposed between the IC chip and the plurality of leads, so that the annular element substantially encircles the IC chip. The package further comprises at least one secondary wire linking the IC chip to the annular element.

Each one of the secondary wires has a first end electrically conductively joined to the first face of the IC element and a second end electrically conductively joined to the first face of the annular element. The annular element according to an aspect of the second exemplary embodiment can be electrically grounded or it can comprise a power source.

According to a third exemplary embodiment of the present invention, an IC package comprises a plurality of leads, each having a first face and a second face opposite to the first face. The package also comprises an IC chip substantially laterally disposed between the plurality of leads and having a first face and a second face opposite to the first face. The package also comprises a thermal dissipation element having a first face and a second face opposite to the first face. The second face of the thermal dissipation element is proximate to the first face of the IC chip and is coupled to the first face of the IC chip through a first coupling material. The second face of the thermal dissipation element extends laterally so that it overhangs the first face to the plurality of leads. The package further comprises a plurality of wires linking the plurality of leads to the IC chip. Each of the plurality of wires has a first end electrically conductively joined to the first face of the IC chip, wherein the first end is disposed between the second face of the thermal dissipation element and the first face of the IC chip. Each of the plurality of wires also has a second end electrically conductively joined to the first face of one of the plurality of leads, wherein the second end is disposed between the second face of the thermal dissipation element and the first face of the one of the plurality of leads.

According to one aspect of the third exemplary embodiment of the present invention, the thermal dissipation element is further coupled to the first face of each of the plurality of leads through a second coupling material.

According to another aspect of the third exemplary embodiment of the present invention, the IC package further comprises an annular element and at least one secondary wire linking the IC chip to the annular element. The annular element is substantially laterally disposed between the IC chip and the plurality of leads, so that the annular element substantially encircles the IC chip. Each of the secondary wires comprises a first end electrically conductively joined to the first face of the IC and a second end electrically conductively joined to the first face of the annular element.

BRIEF DESCRIPTION OF THE DRAWINGS

These and other features, aspects, and advantages of the present invention will become better understood with reference to the following description, amended claims, and accompanying drawings, which should not be read to limit the invention in any way, in which:

DETAILED DESCRIPTION OF THE INVENTION

The present invention will be explained in further detail with reference to the accompanying drawings.

Figure 1:
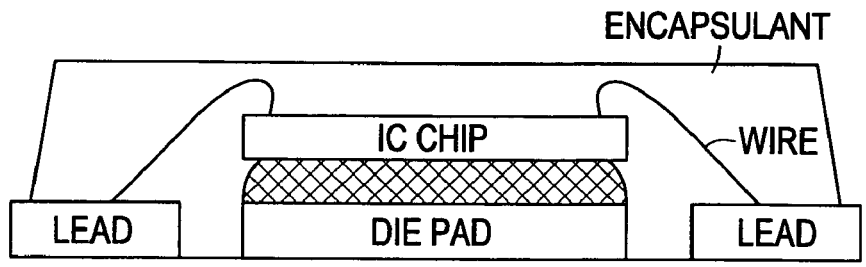
FIG. 1 is a cross-section of a conventional IC package.
Figure 2:
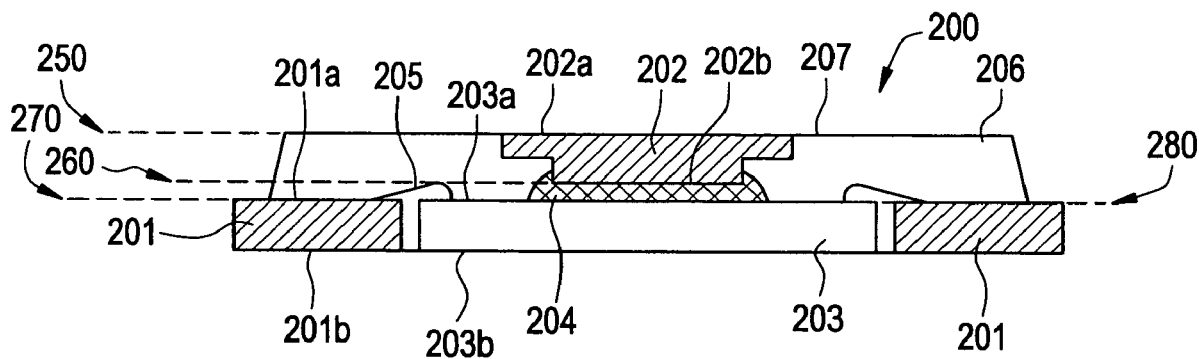
FIG. 2 is a cross-section of an IC package according to a first exemplary embodiment of the present invention.

FIG. 2 illustrates a cross-section of an IC package according to a first exemplary embodiment of the present invention. The IC package 200 comprises a plurality of leads 201, each having a first face 201a and a second face 201b opposite to the first face. Hereinafter, the terms "first" and "second" are merely used for convenience and do not reflect the order of formation, placement, or observation. A die pad 202, as shown has a first face 202a and a second face 202b opposite to the first face. The die pad 202 is orthogonally offset from the leads 201, so that the second face 202b of the die pad 202 is not coplanar with the second face 201b of the leads. The leads 201 and the die pad 202 can be composed of a common copper alloy, such as C194, C7025, C151, or Eftec64T, for example.

An IC chip 203, is disposed, typically laterally, between the leads 201 and has a first face 203a and a second face 203b opposite to the first face. The first face 203a of the IC chip 203 is coupled to the second face 202b of the die pad 202 by an adhesive or the like, which may comprise for example, electrically conductive or non-conductive epoxy, paste or adhesive film, or the like as would be understood by those skilled in the art, and are intended to be encompassed here.

The IC package 200 also comprises a plurality of wires 205 that link the leads 201 to the IC chip 203. The wires 205 can be composed of gold, gold with some level of impurities, aluminum or copper, for example. For use in the wires 205, the gold may contain 1% impurities. These impurities could include dopants or additives included to improve the properties of the wires as would be understood by one of skill in the art. The wires 205 are positioned so as to minimize the profile of the total IC package 200. As such, the first end 205a of each of the wires is electrically conductively joined to the first face 203a of the IC chip 203. This first connection point at the first end 205a is positioned so that it falls between two planes defined within the package. A plane 260 is defined by the second face 202b of the die pad 202. A plane 270 is defined by the first face 203a of the IC chip 203. The first connection point at the first end 205a between wire 205 and the first face 203a of the IC chip 203 is positioned between plane 260 and plane 270. The second end 205b of each of the wires is electrically conductively joined to the first face 201a of a lead 201. This second connection point at second end 205b is positioned so that it falls between two other planes defined within the package. A plane 250 is defined by the first face 202a of the die pad 202. A plane 280 is defined by the first face 201a of the lead 201. The second connection point at second end 205b between wire 205 and the first face 201a of the lead 201 is positioned between plane 250 and plane 280. This positioning of the connection points of the wires 205 allows the wires 205 to be substantially sandwiched between the die pad 202 and the IC chip 203, so as to reduce the size of the overall package profile. The planes 270 and 280 are typically, but need not be coplanar or parallel to each other. Alternative arrangements would be known and understood by those skilled in the art and are intended to be encompassed by this description.

According to one aspect of the first exemplary embodiment of the present invention, the first face 202a of the die pad is adapted to direct coupling with a heat sink, which is discussed below, with reference to FIGS. 3 and 4. This adaptation may, for example, involve maintaining the first face 202a of the die pad 202 from any encapsulant, thus providing a surface for direct coupling with a heat sink.

According to another aspect of the first exemplary embodiment of the present invention, the IC package further comprises an encapsulant 206 that surrounds the first face 203a of the IC chip, the first face 201a of the leads, the wires 205, and the second face 202b of the die pad. The encapsulant 206 provides overall protection to the elements it surrounds and gives added strength and support to the package. The encapsulant can be a polymer-based molding compound or any other of many known encapsulant materials. According to this aspect of the first exemplary embodiment, the first face 202a of the die pad 202 is adapted to direct coupling with a thermal dissipation element, for example, a heat sink. As discussed above, such an adaptation may, for example, involve maintaining the first face 202a of the die pad 202 exposed and not covered by the encapsulant 206. In this way, a heat sink can be coupled directly to the first face 202a of the die pad 202. Further, a planar surface 207 can be formed comprising the first face 202a of the die pad 202 and an outer surface of the encapsulant 206, that can provide a supporting surface for the thermal dissipation element.

Figure 3:
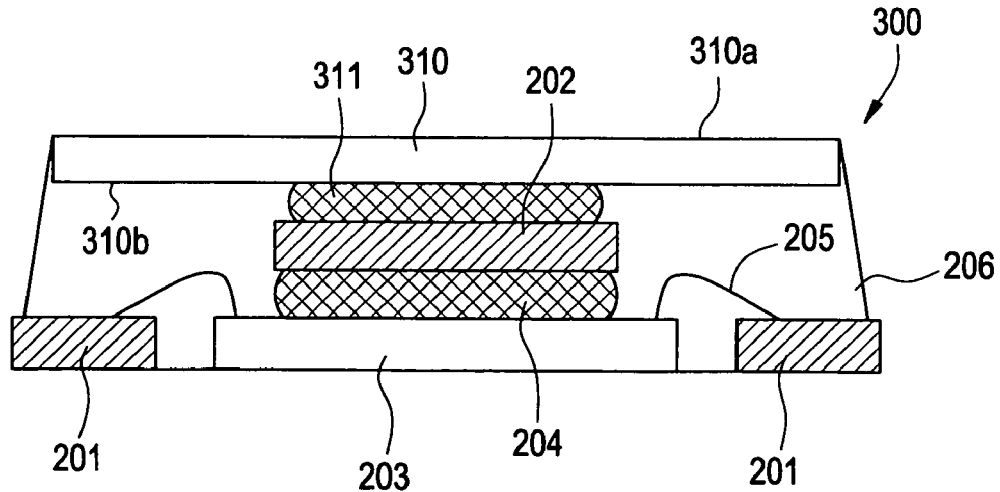
FIG. 3 is a cross-section of an IC package according to an aspect of the first exemplary embodiment of the present invention.
Figure 4:
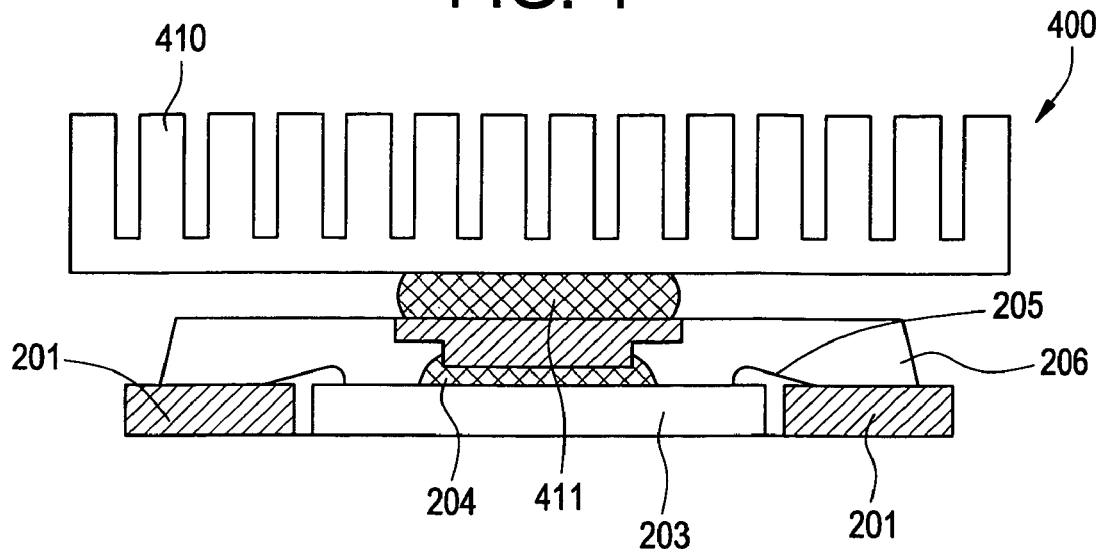
FIG. 4 is a cross-section of an IC package according to another aspect of the first exemplary embodiment of the present invention.

According to a further aspect of the first exemplary embodiment of the present invention, and with reference to FIGS. 3 and 4 respectively, a thermal dissipation element, such as, but not limited to, for example, heat sink 310 or system-level heat sink 410, is coupled to the first face 202a of the die pad. This coupling allows heat generated within the IC package 300 or 400, to be dissipated to the external environment through the thermal dissipation element. The thermal dissipation element can be affixed directly to the first face 202a of the die pad 202, or it can be coupled through a connecting layer 311. The connecting layer 311 may be composed of any form of suitable media, such as film, thermally conductive epoxy, electrically conductive or non-conductive epoxy, or thermal grease, for example. Importantly, the direct coupling of the thermal dissipation element to the first surface of the IC chip provides a highly efficient medium for dissipating heat that is easily and economically achieved.

Figure 5:
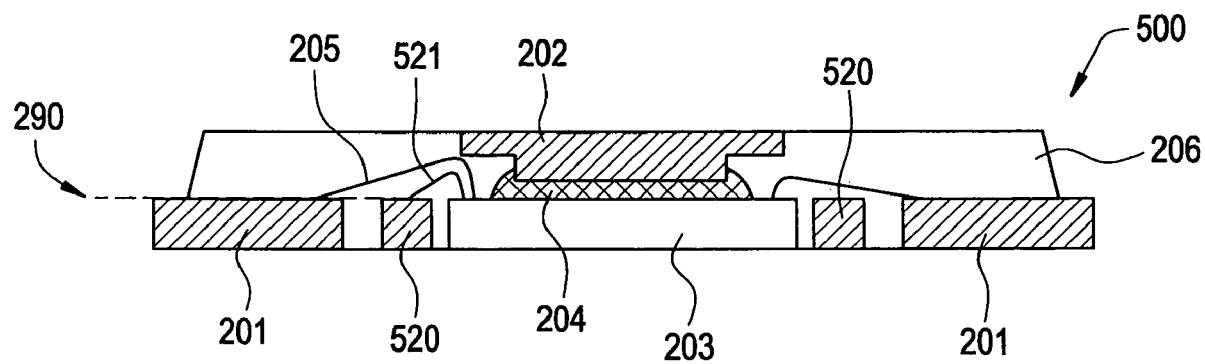
FIG. 5 is a cross-section of an IC package according to a second exemplary embodiment of the present invention.

FIG. 5 illustrates a cross-section of an IC package according to a second exemplary embodiment of the present invention. As described above with reference to FIG. 2, the IC package 500 of FIG. 5 comprises a plurality of leads 201, a die pad 202, an IC chip 203, and a plurality of wires 205. These elements are described with reference to FIG. 2, and are disposed and interconnected as therein described.

The IC package 500 of FIG. 5 further comprises an annular element 520. Annular element 520 is disposed between the plurality of leads 201 and the IC chip 203. In this position, the annular element substantially encircles IC chip 203. IC package 500 also comprises at least one secondary wire 521, which links the annular element 520 to the integrated IC chip 203. As discussed with reference to the plurality of wires 205, the at least one secondary wire 521 may be composed of gold, gold with some level of impurities, aluminum or copper, for example. Further, as with the plurality of wires 205, the at least one secondary wire 521 is positioned so as to minimize the profile of the total package 500. As such, the first end 521a of secondary wire 521 is electrically conductively joined to the first face 203a of the IC chip 203 at a first connection point. The first connection point of the first end 521a is positioned so that it falls between plane 260 and plane 270, defined, respectively, by the second face 202a of the die pad and the first face 203a of the IC chip. The second end 521b of secondary wire 521 is electrically conductively joined to the first face 520a of the annular element 520 as a second connection point. The connection point at end 521b is positioned so that it falls between plane 250 and plane 290 defined, respectively, by the first face of the die pad 202a and the first face of the annular element 520a.

According to two aspects of the second exemplary embodiment of the present invention, the annular element 520 can be electrically grounded, or can comprise a power source. Annular element 520 can also be shaped in a number of ways. Preferably, annular element 520 is shaped so that it is easy to manufacture and so that it contains few, if any, hard corners or edges that would create unwanted anomalies in any electrical field it generates. With these considerations in mind, annular element can be, for example, circular, elliptical, or polygonal.

The IC package according to the second exemplary embodiment of the present invention can further comprise an encapsulant 206, as described above in reference to the first exemplary embodiment of the present invention.

The IC package according to the second exemplary embodiment of the present invention can also further comprise a thermal dissipation element, as described above in reference to the first exemplary embodiment of the present invention.

Figure 6:
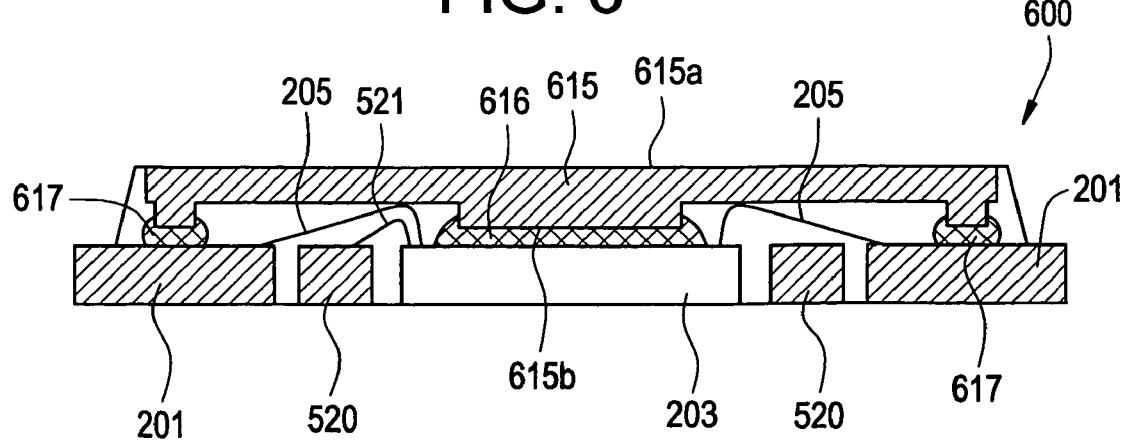
FIG. 6 is a cross-section of an IC package according to a third exemplary embodiment of the present invention.
Figure 7A:
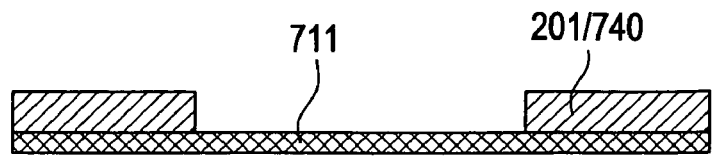
FIGS. 7A through 7G are cross-sections of an IC package in consecutive steps of a manufacturing process according to an exemplary embodiment of the present invention.
Figure 7B:
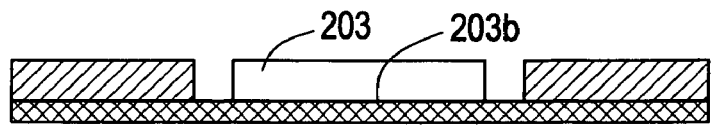
Figure 7C:
Figure 7D:
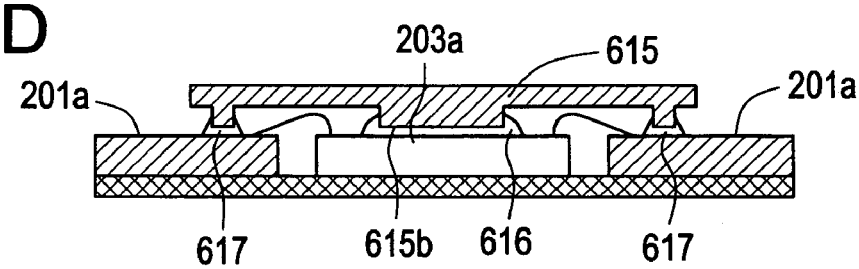
Figure 7E:
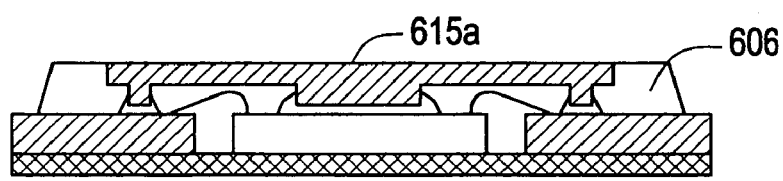
Figure 7F:
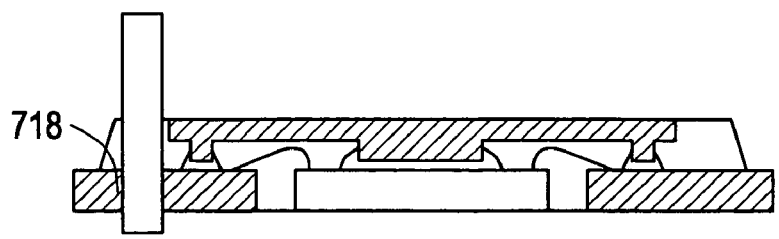
Figure 7G:
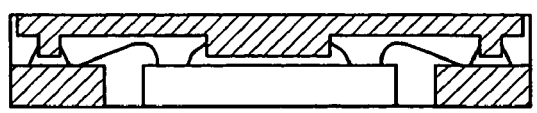
Figure 7H:
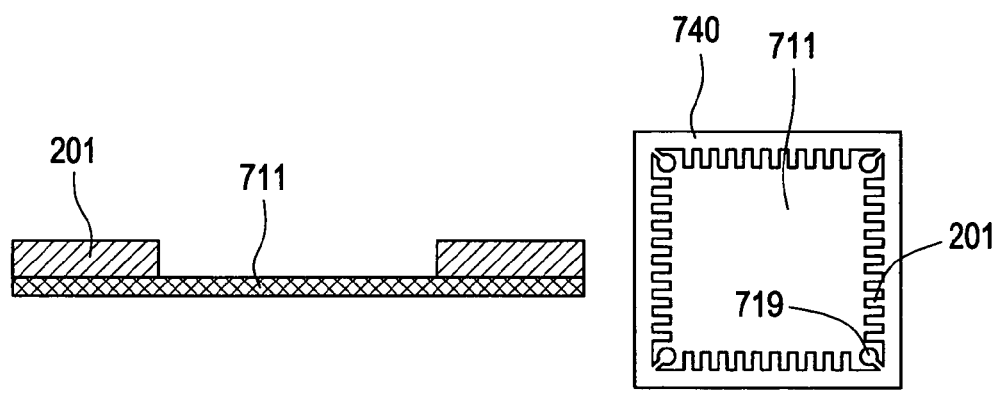
FIGS. 7H and 7I are additional cross-sections and plane views of the IC package manufacturing process of FIGS. 7A through 7G.
Figure 7I:
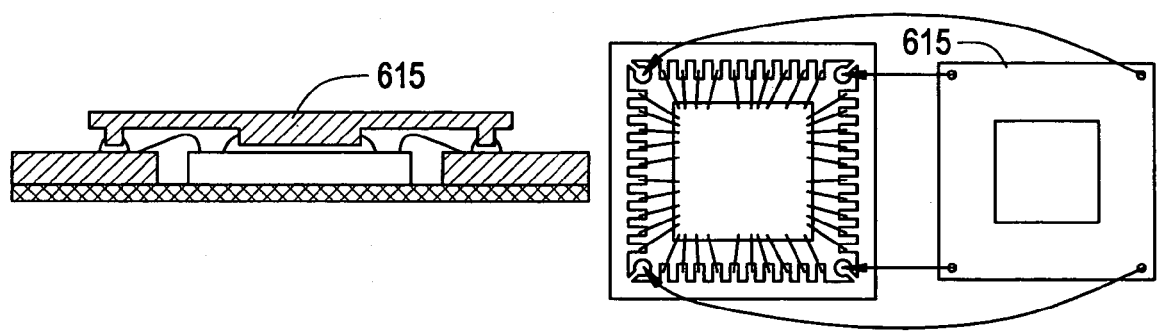

FIG. 6 illustrates a cross-section of an IC package according to a third exemplary embodiment of the present invention. As described above in reference to FIG. 2 and the first exemplary embodiment, the IC package 600 comprises a plurality of leads 201, an IC chip 203, and a plurality of wires 205. These elements are described in reference to the first exemplary embodiment and are disposed in and interconnected as therein described.

The IC package 600 of FIG. 6 further comprises a thermal dissipation element 615, for example, a heat sink, having at least a first face 615a and a second face 615b opposite to the first face 615a. The second face 615b, of the thermal dissipation element 615, is coupled to the first face 203a of the IC chip, through a first coupling material 616. The first coupling material 616 is preferably thermally conductive to allow for optimal heat dissipation from the IC chip 203 through to the thermal dissipation element 615. The first coupling material 616 may also be electrically conductive.

According to an aspect of the third exemplary embodiment, and as illustrated in FIG. 6, the thermal dissipation element 615 may extend laterally to overhang the first face 201a of the leads 201. According to this aspect, the second face 615b of the thermal dissipation element may also be coupled to the first face 201a of the leads 201 though a second coupling material 617. The second coupling material 617 is preferably thermally conductive to allow for optimal heat dissipation from the leads 201 through to the thermal dissipation element 615. The second coupling material may be selected so that it is not electrically conductive. Further, if more than one of the leads are to have a common electrical source while others are not, those having a common electrical source may be coupled with an electrically conductive material while the others are coupled with an electrically non-conductive material. An additional benefit of coupling the thermal dissipation element 615 to the leads 201 is the additional strength and support thus given to the package. According to this aspect, the plurality of wires 205 are sandwiched between the thermal dissipation element 615 and the leads 201 and the IC chip 203.

According to another aspect, the IC package according to the third exemplary embodiment of the present invention further comprises an encapsulant 206, as described above in reference to the first exemplary embodiment of the present invention. According to this aspect, the encapsulant 206 surrounds the first face 201a of the leads 201, the first face 203a of the IC circuit 203, the plurality of wires 205, and the second face 615b of the thermal dissipation element 615.

According to yet another aspect, the IC package according to the third exemplary embodiment of the present invention further comprises the annular element 520 and at least one secondary wire 521, as described above in reference to the second exemplary embodiment of the present invention.

Figure 10:
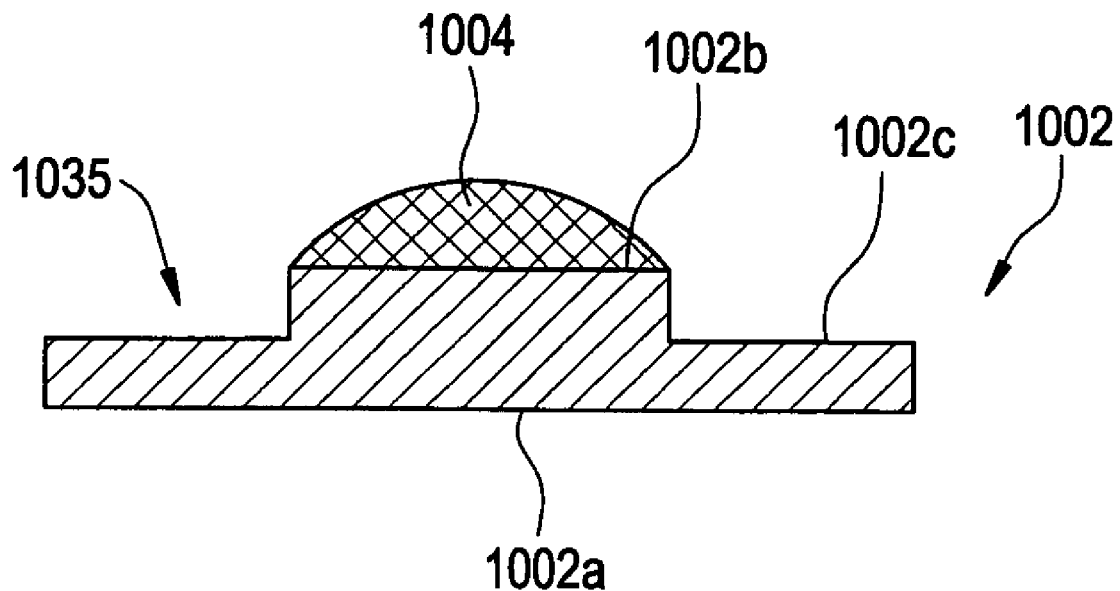
FIGS. 10 and 11 are cross-sections of a die pad according to exemplary aspects of the present invention.
Figure 11:
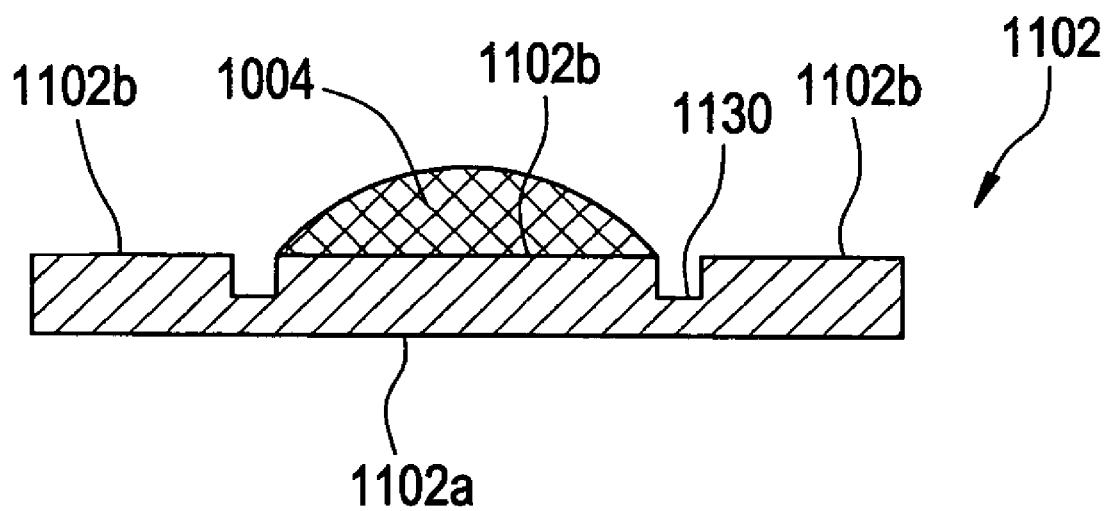

With reference to FIGS. 10 and 11, the die pad 202 of the above-mentioned exemplary embodiments, can be die pad 1002 or die pad 1102, respectively. Die pad 1002 in FIG. 10 has a first face 1002a similar to the first face 202a of die pad 202. Die pad 1002 also has a second face 1002b similar to the second face 202b of die pad 202. However, die pad 1002 also has a cut-out portion 1035 at the periphery of second face 1002b with an inset surface 1002c. The edge formed between second face 1002b and inset surface 1002c can serve as a reference guide to the dispensing of an adhesive component 1004 used to couple the die pad 1002 to another component, such as IC chip 203. The inset surface 1002c may further provide overflow space and may prevent the unwanted spread of adhesive in the event that the adhesive-component 1004 overflows from the second face 1002. Further, the inset surface 1002c is on a different plane from the second face 1002b so that if die pad 1002 is made to extend laterally to overlap with wire 205, illustrated in FIG. 2, clearance space 1035 is provided for wire 205 at connection points 205a and 205b.

Die pad 1102 in FIG. 11 has a first face 1102a similar to the first face 202a of die pad 202. Die pad 1102 also has a second face 1102b similar to second face 202b of die pad 202. However, the second face 1102b of die pad 1102 has a cavity 1130. As with die pad 1002, the cavity 1130 of the die pad 1102 may serve as a reference guide to the dispensing of an adhesive component 1004, and may serve to prevent overflow of the adhesive component 1004 into unwanted areas.

Figure 8:
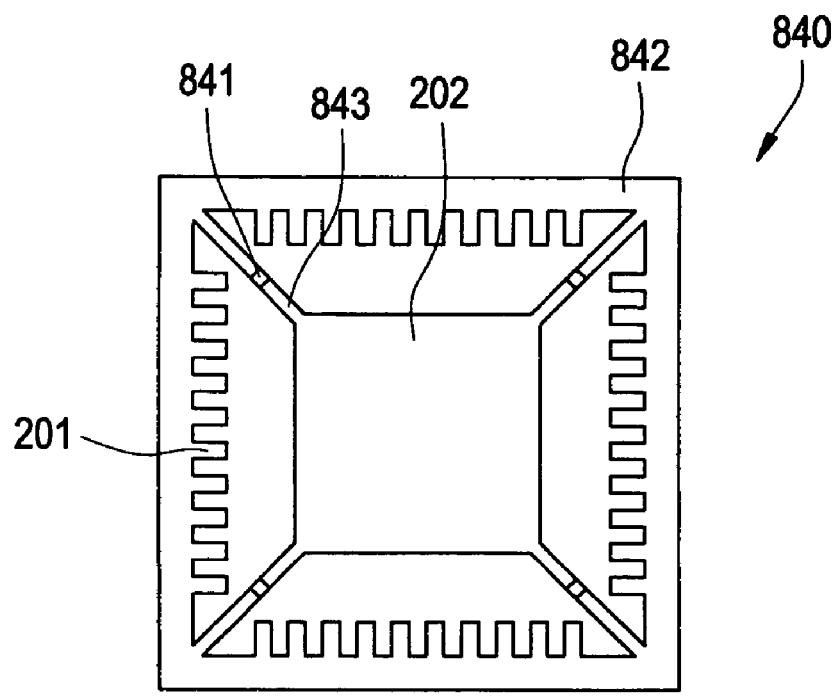
FIGS. 8 and 9 are plane views of leadframes according to exemplary aspects of the present invention.
Figure 9:
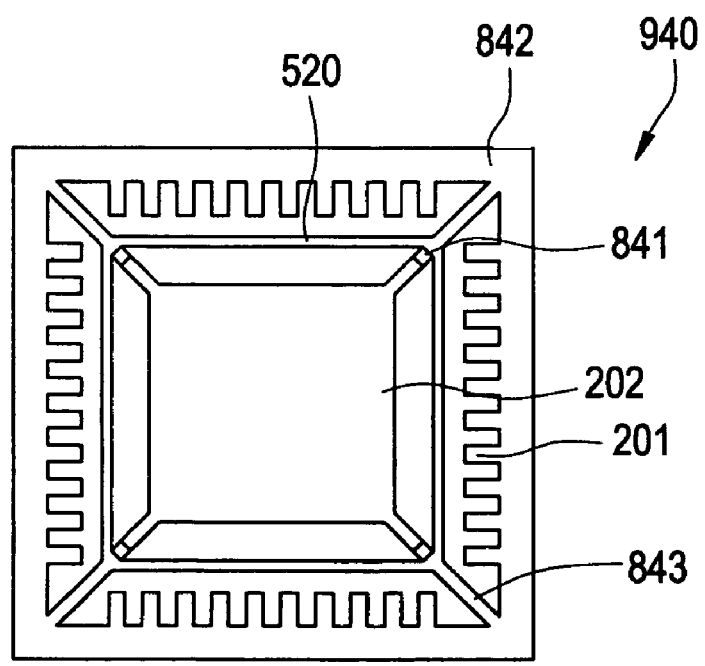

With reference to FIGS. 8 and 9, respectively, the plurality of leads 201 and the die pad 202 of the above-mentioned embodiments can be formed from a leadframe 840 or a leadframe 940 as shown. Leadframe 840 in FIG. 8 comprises an outer frame 842, which supports the plurality of leads 201 extending substantially inward from the outer frame 842. Leadframe 840 further comprises a plurality of tie bars 843 securing the outer frame 842 to the die pad 202, which is substantially centrally located within the leadframe 840. Each of the plurality of tie bars 843 has a mechanical depression 841. The mechanical depression 841 creates an orthogonal offset between the die pad 202 and the plurality of leads 201.

With reference to FIG. 9, leadframe 940 can further comprise an annular element 520. The annular element 520 is disposed between the die pad 202 and the plurality of leads 201 and is connected to the leadframe through the plurality of tie bars 843. The mechanical depressions 841 are disposed inside the annular element 520. In this way, the mechanical depressions 841 create an orthogonal offset between the die pad 202 and the annular element 520 and the plurality of leads 201. The annular element 520 and the plurality of leads 201 can remain coplanar with respect to each other.

Hereinafter, the elements discussed with respect to the following embodiments and aspects are similar to those discussed with respect to the aforementioned embodiments and aspects and may comprise the same exemplary materials and constructions as discussed above.

According to a fourth exemplary embodiment of the present invention, and with exemplary reference to FIG. 2, a method of assembling an IC package comprises providing a plurality of leads, for example leads 201, each having a first face and a second face opposite to the first face, a die pad, for example die pad 202, having a first face and a second face opposite to the first face, an IC chip, for example IC chip 203, having a first face and a second face opposite to the first face, and a plurality of wires, for example wires 205, each having a first end and a second end. The method further comprises orthogonally offsetting the second face of the die pad from the second face of the plurality of leads so that the second face of the die pad and the second face of the plurality of leads are not coplanar. The method further comprises disposing the IC chip substantially laterally between the plurality of leads, as illustrated by IC chip 203 and the plurality of leads 201 illustrated in FIG. 2. A further step of this method comprises coupling the first face of the IC chip to the second face of the die pad, through an adhesive or the like, discussed with respect to the first exemplary embodiment. A further step comprises electrically conductively joining the first end of each of the plurality of wires to the first face of the IC chip, as shown with wires 205 and IC chip 203 in FIG. 2. The step also comprises disposing the first end of each of the plurality of wires between a plane, such as plane 260, defined by the second face of the die pad and a plane, such as plane 280, defined by the first face of the IC chip. Further, a final step comprises electrically conductively joining the second end of each of the plurality of wires to the first face of one of the plurality of leads, as shown with wires 205 and leads 201 in FIG. 2. The step also comprises disposing the second end of each of the plurality of wires between a plane, such as plane 250, defined by the first face of the die pad and a plane, such as plane 270, defined by the first face of the plurality of leads.

According to the fourth exemplary embodiment, the method further comprises encapsulating the first face of the IC chip, the first face of each of the plurality of leads, the plurality of wires, and the second face of the die pad with an encapsulant, such as encapsulant 206 illustrated in FIG. 2. This aspect further comprises adapting the first face of the die pad to direct coupling with a thermal dissipation element, for example, a heat sink. According to another aspect of the fourth exemplary embodiment, a further step comprises forming a planar surface, for example planar surface 207 of FIG. 2, comprising the first face of the die pad and an outer surface of the encapsulant, thus forming a support surface for a heat sink.

According to another aspect of the fourth exemplary embodiment, a further step comprises coupling a thermal dissipation element to the first face of the die pad. The thermal dissipation element can be, but is not limited to, for example, heat sink 310 of FIG. 3 or system-level heat sink 410 of FIG. 4.

According to a fifth exemplary embodiment of the present invention, and with exemplary reference to FIG. 5, a method of assembling an IC package comprises providing a plurality of leads, for example, leads 201, each having a first face and a second face opposite to the first face, a die pad, for example, die pad 202, having a first face and a second face opposite to the first face, an IC chip, for example, IC chip 203, having a first face and a second face opposite to the first face, a plurality of wires, for example wires 205, each having a first end and a second end, an annular element, for example annular element 520, having a first face and a second face opposite to the first face, and at least one secondary wire, for example wire 521 having a first end and a second end. A further step comprises orthogonally offsetting the second face of the die pad from the second face of the plurality of leads so that the second face of the die pad and the second face of the plurality of leads are not coplanar. The method further comprises disposing the IC chip substantially laterally between the plurality of leads, as illustrated, for example, by IC chip 203 and plurality of leads 201 in FIG. 5, and coupling the first face of the IC chip to the second face of the die pad, as illustrated for example by IC chip 203 coupled to die pad 202. In a following step, the method comprises substantially laterally disposing the annular element between the IC chip and the plurality of leads so that the annular element substantially encircles the IC chip, as shown, for example, by annular element 520 illustrated in FIG. 5. Further steps comprise electrically conductively joining the first end of each of the plurality of wires to the first face of the IC chip and electrically conductively joining the second end of each of the plurality of wires to the first face of one of the plurality of leads, as shown, for example, by wires 205 illustrated in FIG. 5. Further, the method comprises, electrically conductively joining the first end of each of the at least one secondary wires to the first face of the IC chip, and electrically conductively joining the second end of each of the at least one secondary wires to the first face of the annular element, as shown, for example, by secondary wire 521 illustrated in FIG. 5.

According to one aspect of the fifth exemplary embodiment, a further step comprises electrically grounding the annular element. In this way, the annular element serves as a ground for the IC chip and any other devices that it may be electrically coupled to.

According to another aspect of the fifth exemplary embodiment, a further step comprises coupling the annular element to a power source.

According to a sixth exemplary embodiment of the present invention, and with exemplary reference to FIGS. 6 and 7A-7I, a method of assembling an IC package comprises providing a plurality of leads 201, an IC chip 203, a thermal dissipation element 615, and a plurality of wires 205. FIGS. 7A-7I, illustrate consecutive steps in the method according to this exemplary embodiment. In a first step, shown in FIG. 7A, an adhesive layer 711 is applied to a leadframe 740 forming the plurality of leads 201, and a plurality of lands 719, shown in FIG. 7H, for a thermal dissipation element. The adhesive layer 711 is used to support the IC chip during attachment. The adhesive layer can be composed a number of materials as discussed with respect to above-described adhesive layers. The leadframe 740 is created without any obvious die pad portion. In a second step, shown in FIG. 7B, a second face 203b of the IC chip 203 is attached to the adhesive layer 711. In a third step, shown in FIG. 7C, the plurality of wires 205 are connected to link the IC chip 203 to the plurality of leads 201, thus providing the necessary electrical paths. In a fourth step, shown in FIGS. 7D, 7H, and 7I, an adhesive 616 is disposed on a first face 203a of the IC chip 203, and an adhesive 617 is disposed on the plurality of lands 719. A second face 615b of the thermal dissipation element 615 is then attached to the IC chip 203 and the plurality of lands 719 through these adhesive layers. According to one aspect of this exemplary embodiment, the thermal dissipation element can be further attached to the plurality of leads 201 through an electrically non-conductive material. The material can be either thermally conductive, thereby providing added heat dissipation for the plurality of leads 201, or may be thermally non-conductive, providing additional support for the overall structure. In a fifth step, shown in FIG. 7E, an encapsulant 606 is applied to the package to encompass the IC chip 203, the plurality of leads 201, the plurality of wires 205, and all but the first face 615a of the thermal dissipation element 615. The encapsulant provides protection for the IC chip. In a sixth step, shown in FIG. 7F, the adhesive layer 711 is removed. Also, unnecessary material 718 from the edges of the package is mechanically removed, thus forming the proper footprint for the package.

According to one aspect of the present invention according to the sixth exemplary embodiment thereof, the method further comprises providing an annular element 520, as shown in FIG. 6 the annular element 520 may be formed as a part of the leadframe 740. At least one secondary wire 521 is provided, linking the IC chip 203 to the annular element 520.

Figure 12:
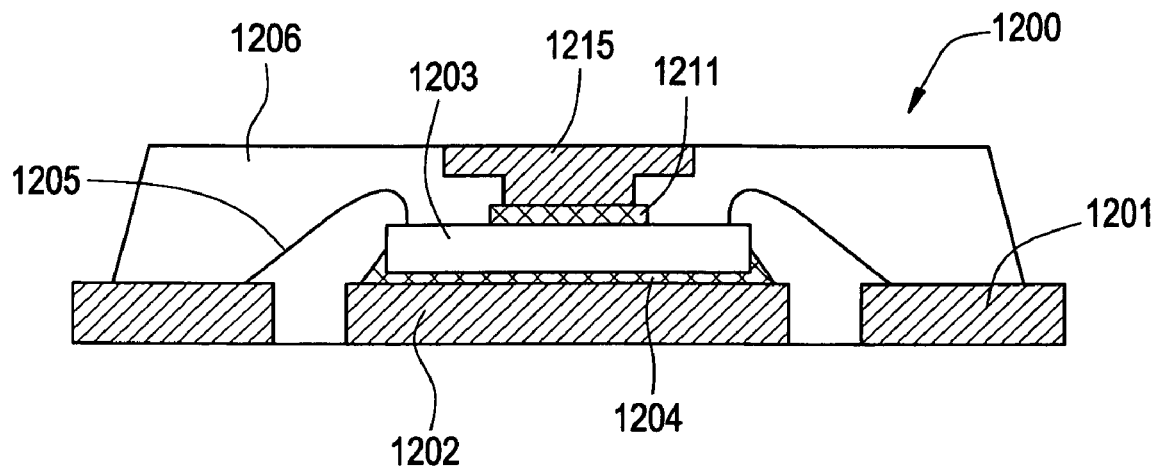
FIGS. 12 through 15 are cross-sections of IC packages according to alternate embodiments of the present invention.
Figure 13:
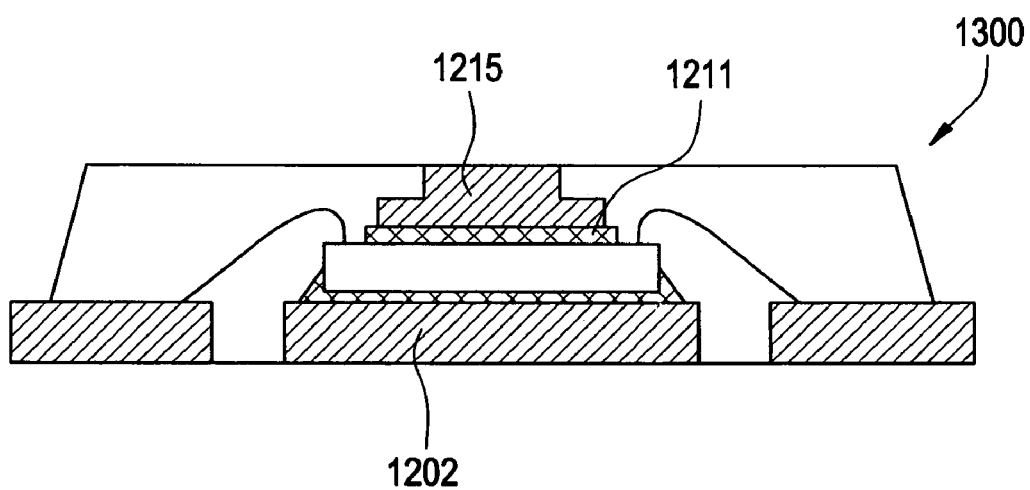

FIGS. 12 and 13 illustrate IC packages according to alternate embodiments of the present invention. FIG. 12 shows an IC package 1200 comprising a die pad 1202 present below a chip 1203. The chip 1203 is attached to the die pad 1202 with an adhesive component 1204, which can be formed of a conductive or non-conductive epoxy, or an adhesive film or tape. A metal lid 1215 is attached to the chip 1203 with an adhesive component 1211, which can be formed of the same exemplary materials as adhesive component 1204.

FIG. 13 illustrates an IC package 1300, similar to IC package 1200. IC package 1300 utilizes an alternative attachment of the metal lid 1215, positioned up-side-down in comparison to the positioning illustrated in FIG. 12.

Figure 14:
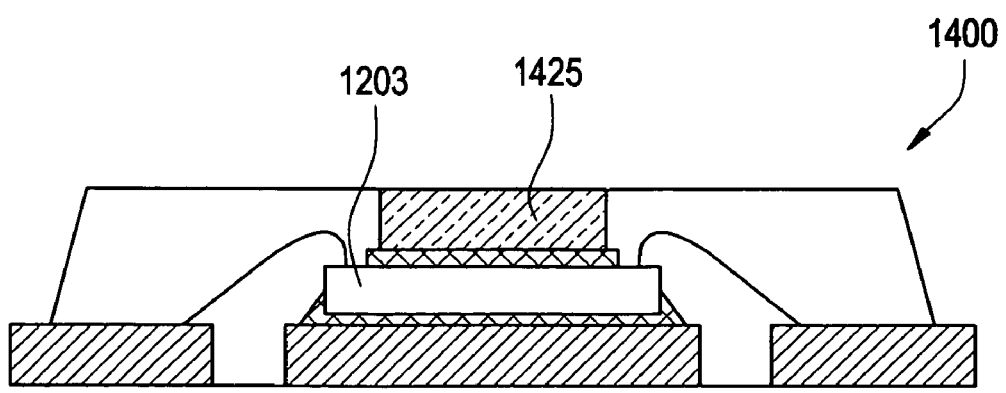

FIG. 14 illustrates an IC package according to another alternative embodiment of the present invention. In comparison to the IC packages of FIGS. 12 and 13, instead of comprising a metal lid, IC package 1400 comprises element 1425, which may be a dummy chip or a glass lid.

Figure 15:
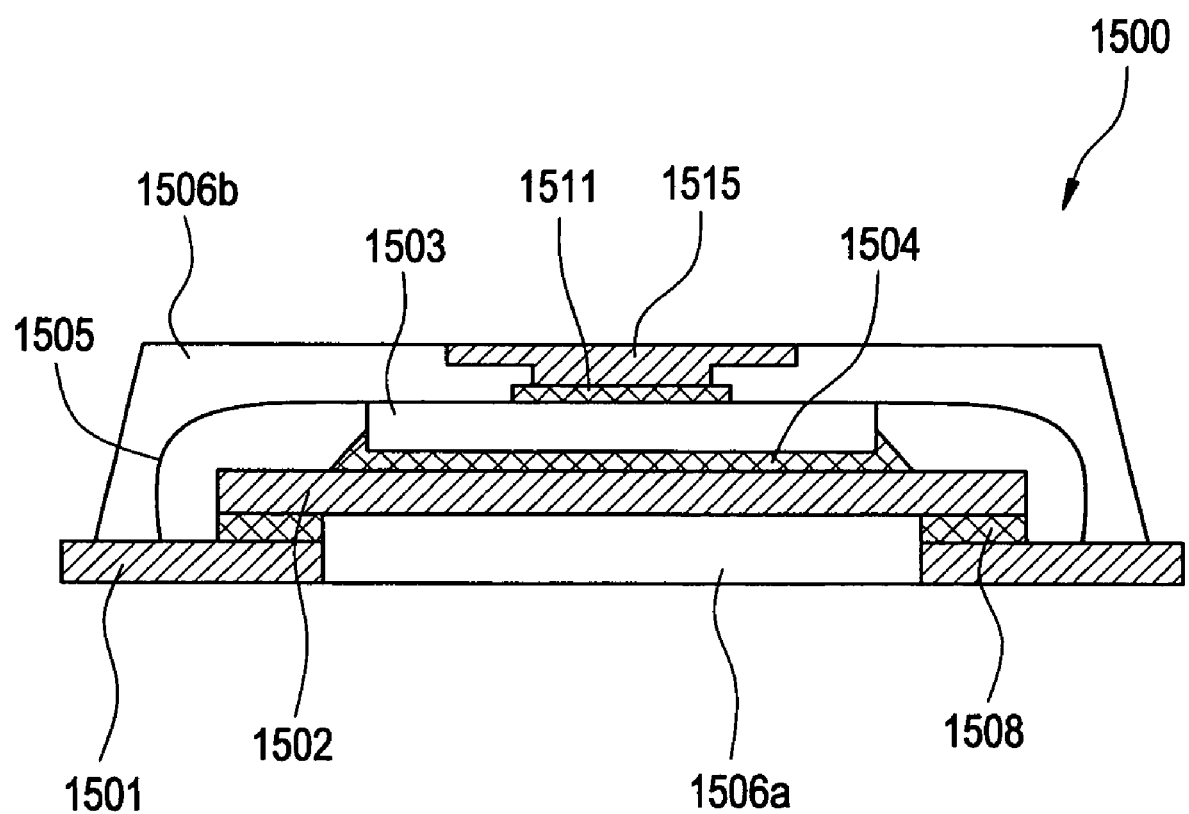

FIG. 15 illustrates an IC package according to yet another alternative embodiment of the present invention. IC package 1500 comprises a die pad 1502 formed of a conductive metal attached to leads 1501 through adhesive component 1508. An IC chip 1503 is mounted on the die pad 1502 through adhesive component 1504. Wires 1505 connect IC chip 1503 to leads 1501, forming an electrical path for signal transmission. An encapsulant 1506b seals all the components. An additional encapsulant 1506a may be disposed under the die pad 1502 to provide added structure to the overall package.

Although the above exemplary embodiments of the present invention have been described, it will be understood by those skilled in the art that the present invention should not be limited to the described exemplary embodiments, but that various changes and modifications can be made within the spirit and scope of the present invention. Accordingly, the scope of the present invention is not limited to the described range of the following claims.

What is claimed is:

1. An integrated circuit package comprising:
   a plurality of leads each having a first face and a second face opposite to said first face;
   a thermal dissipating structure having a first face and a second face opposite to said first face, wherein said second face of said thermal dissipating structure is orthogonally offset from said second face of said leads, such that said second face of said thermal dissipating structure and said second face of said leads are not coplanar;
   an integrated circuit chip substantially laterally disposed between said plurality of leads and having a first face and a second face opposite to said first face, whereby said first face of said integrated circuit chip is proximate to said second face of said thermal dissipating structure and is coupled to said second face of said thermal dissipating structure;
   a plurality of wires linking said plurality of leads to said integrated circuit chip, each comprising:
      a first end electrically conductively joined to said first face of said integrated circuit chip, and
      a second end electrically conductively joined to said first face of one of said plurality of leads;
   an annular element substantially laterally disposed between said integrated circuit chip and said plurality of leads such that said annular element substantially encircles said integrated circuit chip; and
   at least one secondary wire linking said integrated circuit chip to said annular element, each wire comprising:
      a first end electrically conductively joined to said first face of said integrated circuit chip, and
      a second end electrically conductively joined to said first face of said annular element.

2. The integrated circuit package according to claim 1, wherein said annular element is electrically grounded.

3. The integrated circuit package according to claim 1, wherein said annular element comprises a power source.

4. The integrated circuit chip according to claim 1, wherein:
   said plurality of leads, said thermal dissipating structure, and said annular element are formed from a leadframe, said leadframe comprising:
      an outer frame supporting said plurality of leads extending substantially inward from said outer frame,
      said thermal dissipating structure, substantially centrally disposed within said outer frame,
      said annular element, substantially laterally disposed between said thermal dissipating structure and said outer frame, such that said annular element substantially encircles said thermal dissipating structure, and
      a plurality of tie bars securing said outer frame to said annular element and securing said annular element to said thermal dissipating structure; and
   each of said plurality of tie bars includes a mechanical depression, such that an offset is created between said thermal dissipating structure and said annular element.

5. The integrated circuit chip according to claim 1, wherein said thermal dissipating element is a T-shaped heat spreader.

6. The integrated circuit chip according to claim 5, wherein said thermal dissipating element extends over said plurality of wires.

7. The integrated circuit chip according to claim 5, wherein said thermal dissipating element comprises portions that are coupled to said leads.

8. The integrated circuit chip according to claim 5, wherein said portions are coupled to said leads with thermally conductive material.

9. The integrated circuit chip according to claim 7, wherein said portions are coupled to said leads with electrically non-conductive material.

10. The integrated circuit chip according to claim 1, wherein said thermal dissipating element is a die pad.

11. The integrated circuit chip according to claim 1 further comprising an encapsulant, wherein at least said thermal dissipating element is encapsulated by said encapsulant.

12. An integrated circuit package comprising:
   a plurality of leads each having a first face and a second face opposite to said first face;
   a thermal dissipating structure having a first face and a second face opposite to said first face, wherein said second face of said thermal dissipating structure is orthogonally offset from said second face of said leads, such that said second face of said thermal dissipating structure and said second face of said leads are not coplanar;
   an integrated circuit chip substantially laterally disposed between said plurality of leads and having a first face and a second face opposite to said first face, whereby said first face of said integrated circuit chip is proximate to said second face of said thermal dissipating structure and is coupled to said second face of said thermal dissipating structure; and
   a plurality of wires linking said plurality of leads to said integrated circuit chip, each comprising:
      a first end electrically conductively joined to said first face of said integrated circuit chip, and
      a second end electrically conductively joined to said first face of one of said plurality of leads;
   wherein said plurality of leads and said thermal dissipating structure are formed from a leadframe, said leadframe comprising:
      an outer frame supporting said plurality of leads extending substantially inward from said outer frame, and
      said thermal dissipating structure, substantially centrally disposed within said outer frame.

13. The integrated circuit chip according to claim 12, wherein said thermal dissipating structure is connected said outer frame via tie bars.

14. The integrated circuit chip according to claim 12, wherein said thermal dissipating element is a T-shaped heat spreader.

15. The integrated circuit chip according to claim 14, wherein said thermal dissipating element extends over said plurality of wires.

16. The integrated circuit chip according to claim 14, wherein said thermal dissipating element comprises portions that are coupled to said leads.

17. The integrated circuit chip according to claim 16, wherein said portions are coupled to said leads with thermally conductive material.

18. The integrated circuit chip according to claim 16, wherein said portions are coupled to said leads with electrically non-conductive material.

19. The integrated circuit chip according to claim 12, wherein said thermal dissipating element is a die pad.

20. The integrated circuit chip according to claim 12 further comprising an encapsulant, wherein at least said thermal dissipating element is encapsulated by said encapsulant.

* * * * *